United States Patent
Arnold et al.

(10) Patent No.: US 9,190,379 B2
(45) Date of Patent: Nov. 17, 2015

(54) PERIMETER TRENCH SENSOR ARRAY PACKAGE

(71) Applicant: Apple Inc., Cupertino, CA (US)

(72) Inventors: Shawn X. Arnold, San Jose, CA (US); Matthew E. Last, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/629,544

(22) Filed: Sep. 27, 2012

(65) Prior Publication Data

US 2014/0084425 A1  Mar. 27, 2014

(51) Int. Cl.
- *H01L 23/00* (2006.01)
- *H01L 23/538* (2006.01)
- *H01L 23/31* (2006.01)
- *H01L 23/498* (2006.01)

(52) U.S. Cl.
CPC ............. *H01L 24/19* (2013.01); *H01L 23/5389* (2013.01); *H01L 23/3121* (2013.01); *H01L 23/3128* (2013.01); *H01L 23/49822* (2013.01); *H01L 2224/32225* (2013.01); *H01L 2224/48091* (2013.01); *H01L 2224/48227* (2013.01); *H01L 2224/73265* (2013.01)

(58) Field of Classification Search
CPC ... H01L 23/585; H01L 21/78; H01L 23/5226; H01L 2924/01078; H01L 2924/01029; H01L 2924/01013; H01L 2924/01079; H01L 24/83; H01L 2924/14; H01L 27/14618; H01L 25/0657; H01L 2224/16; H01L 23/481; H01L 2924/3011; H01L 2224/48091; H01L 21/76898
USPC ......... 257/620, 774, 782, 783, 784, 786, 680, 257/777, 778, 621, 691, 698
See application file for complete search history.

(56) References Cited

U.S. PATENT DOCUMENTS

| | | | |
|---|---|---|---|
| 6,616,854 B2 | 9/2003 | Jones et al. | |
| 7,351,660 B2 | 4/2008 | Brewer et al. | |
| 8,183,127 B2 | 5/2012 | Patti et al. | |
| 8,238,113 B2 * | 8/2012 | Iihola et al. | 361/761 |
| 8,357,552 B2 * | 1/2013 | Kao | 438/29 |
| 2006/0273380 A1 | 12/2006 | Hshieh | |
| 2009/0250257 A1 * | 10/2009 | Sunohara et al. | 174/260 |
| 2011/0156240 A1 * | 6/2011 | Luan et al. | 257/692 |
| 2013/0069176 A1 * | 3/2013 | Daamen et al. | 257/414 |

* cited by examiner

*Primary Examiner* — A. Sefer
*Assistant Examiner* — Dilinh Nguyen
(74) *Attorney, Agent, or Firm* — Downey Brand LLP

(57) ABSTRACT

One embodiment of a perimeter trench sensor array package can include a thinned substrate device that includes a perimeter trench formed near the edges of the device that can be configured to be thinner than a central portion of the thinned substrate device. The perimeter trench can include bond pads that can couple to electrical elements included in the thinned substrate device. The thinned substrate device can be attached to a core layer that can in turn support one or more resin layers. The core layer and the resin layers can form a printed circuit board assembly, a flex cable assembly or a stand-alone module.

20 Claims, 5 Drawing Sheets

PERIMETER TRENCH SENSOR ARRAY PACKAGE

FIELD OF THE DESCRIBED EMBODIMENTS

The described embodiments relate generally to electronic modules and more particularly to electronic modules including thinned substrates that include perimeter edge trenches.

BACKGROUND

Integrated circuits have long become a mainstay of many electronic designs. Many items such as processors, memories, custom electronic designs including application specific integrated circuits (ASICs), field programmable gate arrays and sensors use integrated circuit device technology to manufacture these items. Integrated circuit technologies can produce devices en masse, typically on a substrate commonly referred to as a wafer. Individual devices can be separated from the wafer to form dies that include the device.

A typical wafer thickness can be between 500 and 750 microns. For some applications, a smaller thickness can be desired, so the wafer can be thinned to reduce the final thickness of the related device. Mounting thinned devices can be problematic as traditional mounting approaches can consume a relatively large volume, and any size advantages gained by using a thinned-substrate device can be lost. Furthermore, mounting approaches need to efficiently provide ways to couple electrical power and signals to and from the thinned device without adding undue thickness.

Therefore, what is desired is a space efficient way to support and mount thinned-substrate devices and couple electrical power and signals to and from thinned devices.

SUMMARY OF THE DESCRIBED EMBODIMENTS

This paper describes various embodiments that relate to thinned substrate devices and modules configured to support thinned substrate devices.

A circuit module for thinned devices can include a core layer, a thinned substrate device including a central area and at least one perimeter edge trench that is thinner than the central area and can include a bond pad. The thinned substrate device can be bonded to the core layer. A first resin layer can be placed on the core layer next to the thinned substrate device and can have a surface planar to a top surface of the thinned substrate device. A second resin layer can be placed on the core layer on the side opposite the thinned substrate device. A pad layer can be disposed on the second resin layer.

In another embodiment, a method for forming a thinned substrate module can include steps for receiving a thinned substrate device, bonding the device to a core layer, placing a resin layer on the core layer next to the thinned substrate device so that one surface of the resin layer is planar with a surface of the thinned substrate device, coupling a bond bad on a perimeter trench area to a conductive trace on the first layer, placing a second layer on the core layer on the side opposite the thinned substrate device and coupling the conductive trace to an electrical contact.

In another embodiment, a low-profile circuit module can include a thinned substrate device with a central area and at least one perimeter trench area that is thinner than the central area and includes a bond pad. The circuit module can further include a supporting substrate with a stepped opening configured to conform in size and shape to the thinned substrate device. The supporting substrate can include a surface that couples with the perimeter trench area. A via can couple a bond pad on the perimeter trench area to a conductive trace.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The embodiments will be readily understood by the following detailed description in conjunction with the accompanying drawings, wherein like reference numerals designate like structural elements.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Electrical devices that are manufactured with well-known integrated circuit techniques are produced on wafers that are often between 500 and 750 microns thick. This may be too thick for some applications and the electrical device can be thinned to provide a more desirable thickness. Mounting the thinned device can be problematic, however, and any volume gains from thinned substrates can be lost when traditional printed circuit board mounting techniques are used.

One approach to a more space efficient thinned substrate solution forms one or more perimeter trench areas near the edge of thinned substrate devices. The perimeter trench areas can be thinner than other regions of the thinned device and can accommodate bond pads that can provide electrical connections to and from the thinned device. The thinned device can then be mounted within a lamination of resin layers that can support conductive elements such as traces that can couple to the bond pads in the perimeter trench areas.

Figure 1:
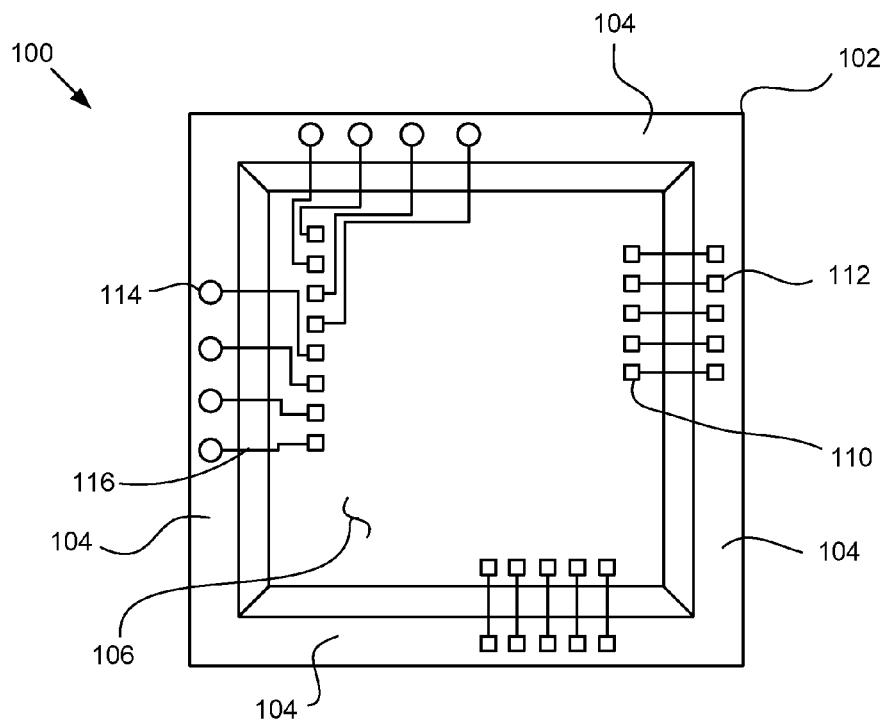
FIG. 1 is a simplified diagram showing a top view of a thinned device in accordance with one embodiment described in the specification.

FIG. 1 is a simplified diagram 100 showing a top view of a thinned device 102 in accordance with one embodiment described in the specification. The thinned device 102 can be an electrical component such as an integrated circuit or a sensor formed on a substrate that can later be thinned. Common substrates can be silicon and gallium arsenide, however any other technically feasible substrate can be used. Thinned device 102 can include a central area 106. The central area 106 can make up a majority of the area of the thinned device 102. Thinned device 102 can also include one or more perimeter trench areas 104. The thinned device 102 as shown includes four perimeter trench areas 104 disposed on the edges of thinned device 102. The perimeter trench area can be a region of the substrate that is lower in height relative to other regions of the thinned substrate 102.

As shown on FIG. 1, the central area 106 can include bond pads 110. Bond pads 110 can be coupled to circuits and electrical nodes within the thinned device 102 to control, power and transfer data with circuits that are included in central area 106. The perimeter trench areas 104 can be used to couple external signals to and from thinned device 102. In one embodiment, pads such as laser pads 114 can be disposed onto the perimeter trench areas 104. Laser pads 114 can be used to couple signals from other sources, such as other printed circuit or flexible circuit boards to thinned device 102. As shown bond pads 110 can be relatively close to laser pads 114 and allow bond traces 116 to be routed relatively perpendicular to the peripheral trench area 104. In other embodiments, bond traces 116 can traverse the central area 106 and/or the perimeter trench area 104 to couple the bond pads 110 to the laser pads 114.

Thinned device 102 can also include wire bond pads 112 disposed in perimeter trench areas 104. Similar to laser pads 114, wire bond pads 112 can couple signals to and from thinned device 102 through bond traces 116. As shown, bond traces 116 can be routed relatively perpendicularly; however in other embodiments, bond traces 116 can also traverse the central area 104 and perimeter trench areas 104 at any technically feasible angle.

Figure 2:
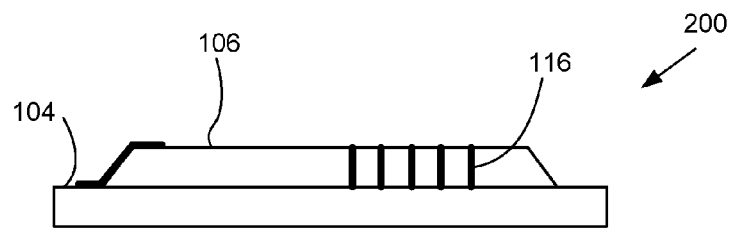
FIG. 2 shows a side view of a thinned device.

FIG. 2 shows a side view 200 of thinned device 102. Bond traces 116 are more clearly shown traversing between perimeter trench areas 104 and central area 106. Perimeter trench areas 104 can be formed with any technically feasible method. In one embodiment, peripheral trench areas can be formed with deep reactive ion etching (DRIE). Side view 200 can more clearly illustrate a height difference between perimeter trench areas 104 and central area 106. This height difference can advantageously be used support thinned device 102 while also coupling signals to and from thinned device 102.

Figure 3:
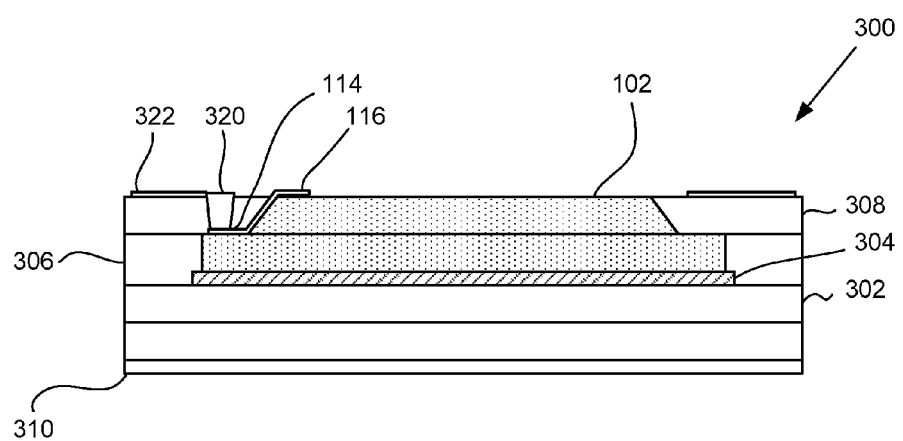
FIG. 3 is a cross sectional view of a thinned device mounted within a cavity.

FIG. 3 is a cross sectional view 300 of thinned device 102 mounted within a cavity. In one embodiment, the cavity can be formed within a printed circuit board (PCB) 310. The cavity may be formed by attaching the thinned device 102 to a first layer and then positioning one or more layers around the thinned device 102. In this example, thinned device 102 is coupled to a core layer 302 with an adhesive 304. As illustrated in FIG. 3, the bond traces 116 can be routed on a beveled or sloped perimeter of the central area 106. The beveled portion extends from the perimeter trench areas 104 to a central area 106 (shown in FIG. 1). At the perimeter trench areas 104, the laser pads 114 are connected to the bond trades 116, and the bond traces 116 extend over an inclined edge portion of the central area 106. The bond traces 116 can extend parallel over a planar portion of the central area 106 and connect to the bond pads 110.

In one embodiment, another layer can be positioned adjacent to the core layer 302 such that at least one surface of the additional layer can be planar with the top of thinned device 102. In other embodiments, more than one layer can be disposed over the core layer 302. Returning to FIG. 3, a first layer 306 and a second layer 308 are disposed over the core layer 302. As shown, second layer 308 is configured so that one surface of second layer 308 is planar with the top of thinned device 102. Layers can be comprised of a resin, a resin composite, printed circuit board pre-impregnated (pre-preg) material or any other technically feasible material.

First layer 306 and second layer 308 can include a conductive layer disposed on each surface of each layer. Conductive traces can be formed on conductive layers that can, in turn, carry power and signals to and from thinned silicon 102. Laser via 320 can be formed and can contact laser pad 114. Laser via 320 can couple laser pad 114 to a conductive trace 322 and thereby route a signal from laser via 320 to other locations on printed circuit board 310. Conductive traces and trace layers can be copper, aluminum, tin or any other conductive material. Any technically feasible technology can be used to place, route and couple laser pads 114, wire bond pads 112 (not shown) or other contacts included in thinned device 102 to other areas in the printed circuit board 310. As shown, additional layers can be positioned adjacent to a second side of the core layer 302. Conductive trace layers can be disposed on surfaces of these additional layers as well.

Since thinned device 102 is advantageously affixed within PCB 310, electrical signals can easily be coupled to the appropriate bond pads such as laser pad 114. In one embodiment, PCB 310 can be a rigid PCB, a rigid-flex PCB, a flexible PCB or any other technically feasible laminated structure. Additional resin layers can be added as required using well-known PCB manufacturing techniques. In this example, additional layers are shown disposed adjacent to an opposing side of the core layer 302 (with respect to first and second layers 306 and 308).

Figure 4:
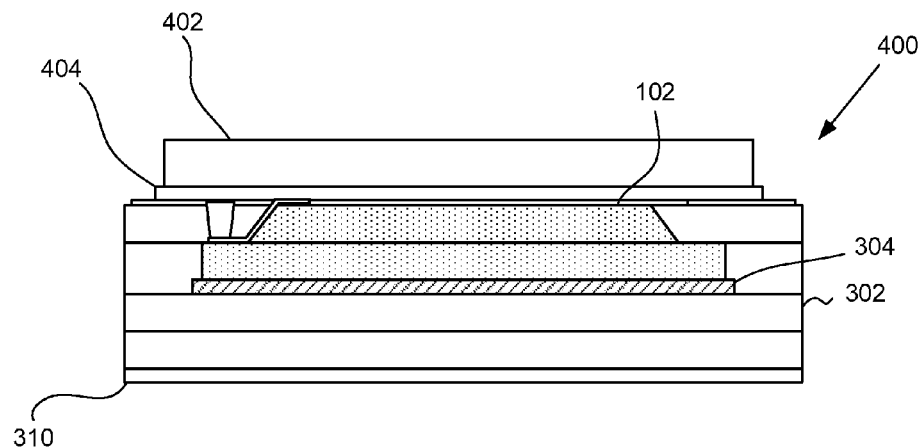
FIG. 4 is a cross sectional view of another embodiment of thinned device mounted within a cavity.

FIG. 4 is a cross sectional view 400 of another embodiment of thinned device 102 mounted within a cavity. Construction of the assembly shown in FIG. 4 can be substantially similar to FIG. 3 with thinned device 102 bonded to core 302 with adhesive 304. Additionally, a cover 402 can be attached with an adhesive 404 over thinned device 102. In one embodiment, cover 402 can be clear, relatively clear or translucent. A clear cover 402 can allow central area 106 to be at least partially exposed to the environment which can be a useful configuration when thinned device 102 is a sensor.

Figure 5:
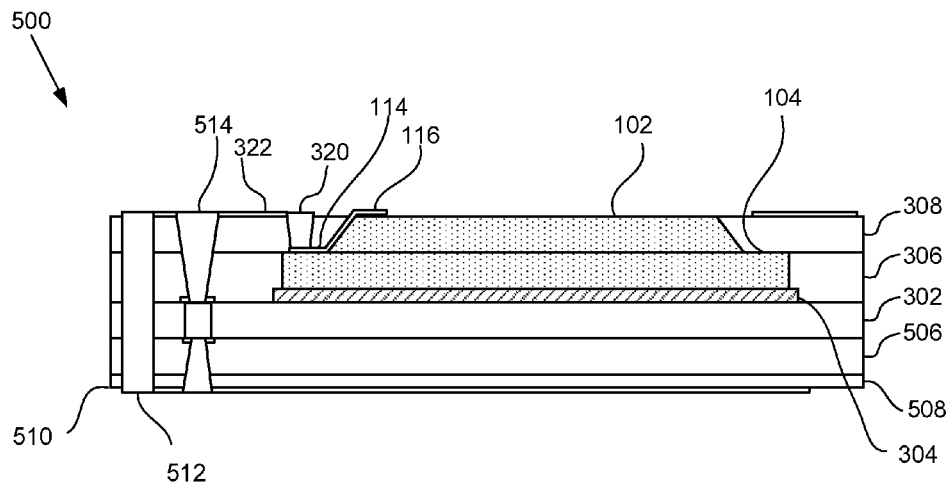
FIG. 5 is a cross sectional view of one embodiment of a thinned device module.

FIG. 5 is a cross sectional view 500 of one embodiment of thinned device module 510. Thinned device 102 can be positioned in cooperation with one or more layers, such as resin layers, to form a module that in turn can be mounted to a PCB or other appropriate substrate. In other embodiments, thinned device 102 can be mounted within a PCB as described above. Layers can be composed of a resin, a resin composite, pre-preg or any other technically feasible material. As previously described, thinned device 102 mounted to core layer 302 with adhesive 304. Thinned device 102 can include one or more perimeter edge trench areas 104 that in turn can include bond pads such as laser bond pads 114 coupled to electrical elements within thinned device 102 with trench traces 116. Additional layers such as first layer 306 and second layer 308 can be disposed over core layer 302 such that one layer (in this example second layer 308) can be configured to have at least one surface substantially planar with the top of thinned device 102. Additional layers such as third layer 506 and fourth layer 508 can be adjacent to a second side of the core layer 302.

In one embodiment, thinned device module 510 can include conductive material disposed over any surface of any layer. The conductive material can be used to form traces and trace layers that can be configured to carry electrical signals and power to and from the thinned device 102. Thinned device module 510 can include a via, such as a laser via 320, that can be configured to couple a bond pad disposed on the perimeter trench area 104 to a conductive trace 322 or trace layer. Vias can also be used to couple signals from a first trace or trace layer to a second trace or trace layer. For example, if the thinned device module 510 is configured such that conductive traces or trace layers are only placed on external surfaces (a two conductive layer design), then a thru via 512 can be used to couple a trace or trace layer between external surfaces. Alternatively, if thinned device module 510 comprises more than two conductive layers (a multi-layer design), then other types of vias can be used to couple conductive traces or trace layers. For example, stacked micro vias 514, stacked laser vias, hidden vias or any other feasible technology can be used to couple signals between conductive elements.

Figure 6:
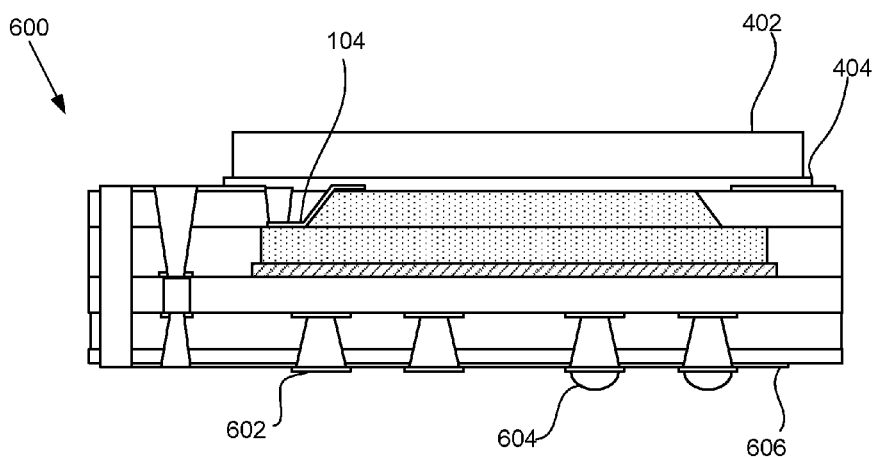
FIG. 6 is a cross sectional view of another embodiment of thinned device module

FIG. 6 is a cross sectional view 600 of another embodiment of thinned device module 510. In this embodiment, a clear cover 402 can be attached with an adhesive 404 to thinned device module 510. One or more electrical contacts such as pads forming a land grid array 602 can be disposed on an external surface. The land grid array pads 602 can be coupled to one or more conductive layers or traces that are further coupled to bond pads disposed on perimeter trench areas 104. In another embodiment, conductive spheres 604 can be disposed on an external surface to form electrical contacts. Conductive spheres 604 can be metallic spheres, or a resin sphere covered with a conductive coating or skin. In yet another embodiment, conductive spheres 604 can be chip scale package (CSP) balls. In still another embodiment, conductive spheres 604 can be conductive contact bumps. In one embodiment a redistribution layer 606 can be used to route particular signals to particular pads 602 or spheres 604. Although shown as an external layer, redistribution layer 606 can be realized on any other layer within the thinned device module 510.

Figure 7:
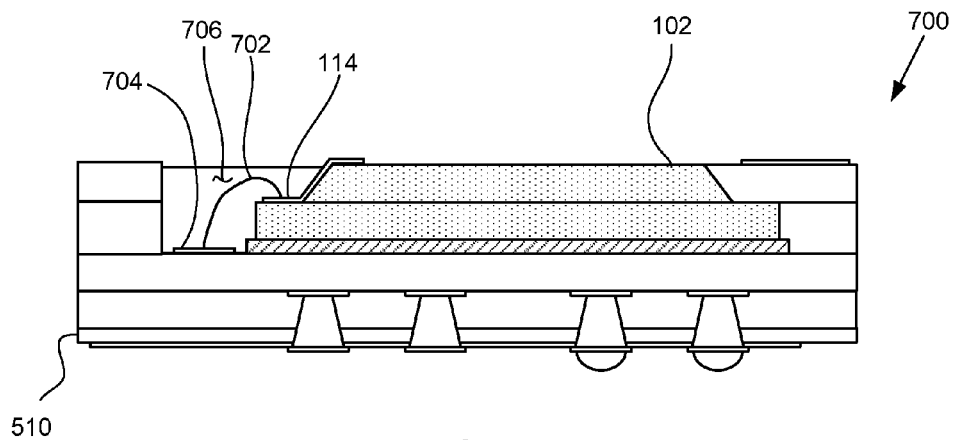
FIG. 7 is a cross sectional view of still another embodiment of a thinned device module.

FIG. 7 is a cross sectional view 700 of still another embodiment of a thinned device module 510. In this embodiment a cavity 706 can be formed in a region near a perimeter trench area 104. In cavity 706 a bond wire 702 can couple a bond pad such as laser bond pad 114 to a conductive layer 704. In the example shown in FIG. 7, conductive layer 704 is disposed on the first side of core layer 302, but in other embodiments, bond wire 702 can couple bond pad 114 to any layer within thinned device module 510. After bond wire 702 is attached to laser bond pad 114 and conductive layer 704, cavity 706 can be filled with any technically suitable filler such as an epoxy, a thermoset resin, a thermoplastic or silicon. Conductive layer 704 can be coupled to any other conductive layer through vias as described earlier in with FIGS. 5 and 6. Although not shown, cover 402 can also be attached to this embodiment of thinned device module 510.

Figure 8:
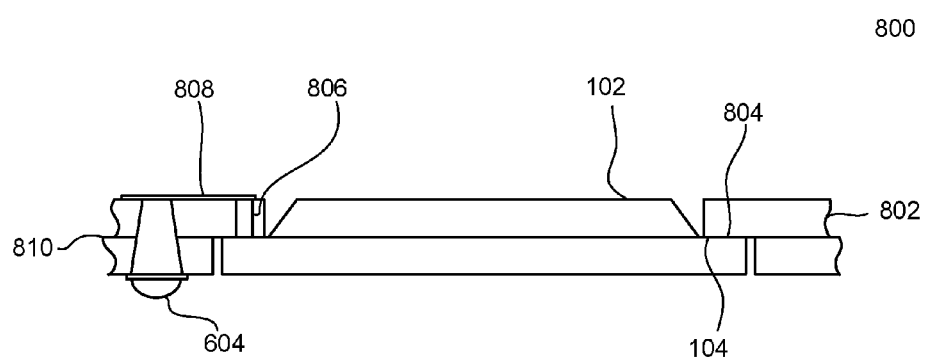
FIG. 8 is a cross sectional view of a low-profile thinned device module.

FIG. 8 is a cross sectional view 800 of a low-profile thinned device module 810. Thinned device 102 can be affixed to an opening formed in substrate 802. In one embodiment, substrate 802 can be a flexible cable, a rigid-flex cable a single or multi-layer PCB or any other technically suitable substrate. The opening can substantially conform in size and shape to thinned device 102. In one embodiment, a surface 804 of substrate 802 can be configured to contact and affix to perimeter trench area 104 of thinned device 102. Vias 806 can couple bond pads on perimeter trench 104 to one or more conductive layers 808. In some embodiments, an electrical contact such as a conductive sphere 604 or a land pattern (not shown) can be disposed on one surface of substrate 802 to provide electrical contacts for thinned device 102. In one embodiment, substrate 802 can be configured to be a thickness similar to thinned device 102. Such an arrangement can provide a low-profile mounting solution for thinned device 102 that can be useful in situations limited vertical space.

Figure 9:
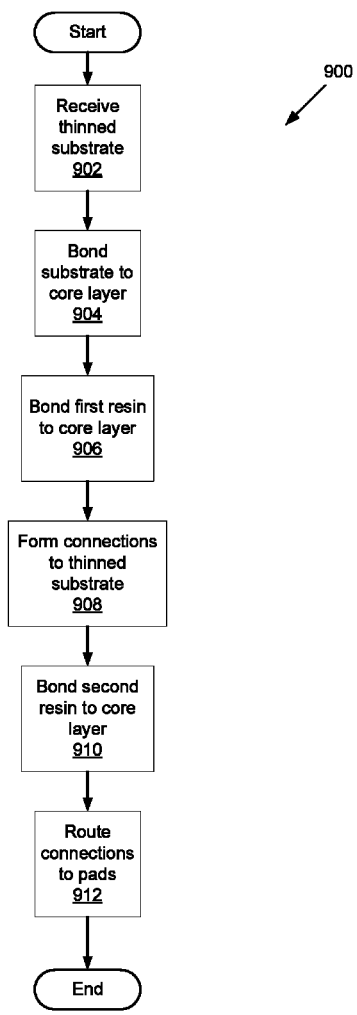
FIG. 9 is a flow chart 900 of method steps for thinned substrate device circuit module

FIG. 9 is a flow chart 900 of method steps for thinned substrate device circuit module. Persons skilled in the art will understand that any system configured to perform the method steps in any order is within the scope of this description. The method can begin in step 902 where the thinned substrate device 102 is received. In step 904, the thinned substrate device 102 can be bonded or attached to the core layer 302. In one embodiment, thinned substrate device 102 can be attached to the core layer with an adhesive 304. In step 906, a first resin layer is disposed over a first side of the core layer 302 and around thinned substrate device 102. In one embodiment, the first resin layer can include a first surface that can be substantially planar with an upper surface of thinned device 102. In step 908, electrical connections can be formed between bond pads included with the thinned substrate device 102 and one or more conductive layers. In one embodiment vias may be used to couple bond pads to the one or more conductive layers. In step 910, a second resin layer can be disposed proximate to a second side of the core layer 302. In step 912, signals on the one or more conductive layers can be coupled to one or more electrical contacts.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:
1. A circuit module, comprising:
   a core layer; and
   a reduced substrate device, including:
      a central area having a beveled perimeter, a perimeter trench area configured to border the beveled perimeter of the central area and at least partially define a cavity with a side of the core layer, wherein the cavity is at least partially filled with a material for at least partially encapsulating a bond wire that extends from a first bond pad on the perimeter trench area, over the beveled perimeter of the central area, and connects to a second bond pad on a partially exposed surface of the central area.

2. The circuit module of claim 1, wherein the reduced substrate device is configured to conform in size and shape with a stepped opening in a supporting substrate, and the perimeter trench area is coupled to a surface of the stepped opening in the supporting substrate.

3. The circuit module of claim 2, further comprising:
a via for connecting the second bond pad to a first conductive trace that is on a surface of a first resin layer; and
a through via for connecting the first conductive trace to a second conductive trace on a surface of a second resin layer.

4. The circuit module of claim 2, wherein a first conductive trace is disposed on an externally facing surface and coupled to a second conductive trace.

5. The circuit module of claim 4, wherein the first conductive trace is disposed on the externally facing surface and is coupled to the second conductive trace with a first via.

6. The circuit module of claim 2, further comprising:
a conductive sphere disposed on an externally facing surface and coupled to a second conductive trace.

7. The circuit module of claim 1, further comprising a cover layer adjacent to the central area.

8. The circuit module of claim 1, further comprising a conductive sphere disposed on an externally facing surface and coupled to the bond wire.

9. The circuit module of claim 1, further comprising:
a plurality of electrical contacts forming a land grid array on an external surface opposite to the reduced substrate device.

10. The circuit module of claim 1, wherein at least one of a first resin layer and a second resin layer are (i) disposed on a side of the core layer and (ii) composed of material selected from a group consisting of a resin, a resin composite, and a pre-impregnated material.

11. The circuit module of claim 1, wherein the reduced substrate device is mounted within a printed circuit board (PCB).

12. The circuit module of claim 1, wherein the reduced substrate device is disposed within a substrate layer connected to the core layer.

13. A low profile sensor, comprising:
a first planar surface comprising a partially exposed central area and a first bond pad;
a sloped surface that extends from the first planar surface to a second planar surface;
the second planar surface comprising a second bond pad that is vertically displaced from the first bond pad, wherein the second planar surface extends from an edge of the sloped surface a distance that is less than a width of the first planar surface; and
an electrically conductive trace disposed onto the sloped surface to connect the first bond pad and the second bond pad.

14. The low profile sensor of claim 13, wherein the low profile sensor is configured to conform in size and shape with a stepped opening in a supporting substrate, wherein the sloped surface is coupled to a surface of the stepped opening in the supporting substrate.

15. The low profile sensor of claim 13, wherein the electrically conductive trace extends over the sloped surface at an angle less than ninety degrees relative to the first planar surface.

16. The low profile sensor of claim 13, wherein the electrically conductive trace is adjacent to the partially exposed central area and extends from the first planar surface over the sloped surface at an angle greater than 180 degrees relative to the first planar surface.

17. The low profile sensor substrate of claim 13, further comprising a plurality of electrically conductive traces disposed onto the sloped surface.

18. The low profile sensor of claim 13, further comprising:
a first electrically conductive trace and a second electrically conductive trace, wherein the first electrically conductive trace and the second electrically conductive trace include a parallel portion extending over the sloped surface.

19. A sensor, comprising:
a substrate device comprising:
a central area characterized as having a first length, a beveled perimeter, and partially exposed surface configured to be an interface for the sensor,
a perimeter trench area that extends from a border of the beveled perimeter of the central area a second length that is less than the first length, and
a bond trace, extending from a first bond pad on the perimeter trench area, over the beveled perimeter of the central area, and connecting to a second bond pad adjacent to the partially exposed surface of the central area; and
a supporting substrate having a surface to which the perimeter trench area is coupled.

20. The sensor of claim 19, wherein the substrate device is configured to conform in size and shape with the opening in the supporting substrate.

* * * * *